US011043248B2

(12) United States Patent
Noel et al.

(10) Patent No.: US 11,043,248 B2
(45) Date of Patent: Jun. 22, 2021

(54) CIRCUIT FOR DETECTION OF PREDOMINANT DATA IN A MEMORY CELL

(71) Applicant: COMMISSARIAT A L'ENERGIE ATOMIQUE ET AUX ENERGIES ALTERNATIVES, Paris (FR)

(72) Inventors: Jean-Philippe Noel, Grenoble (FR); Reda Boumchedda, Grenoble (FR); Bastien Giraud, Grenoble (FR); Emilien Bourde-Cice, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 10 days.

(21) Appl. No.: 16/738,233

(22) Filed: Jan. 9, 2020

(65) Prior Publication Data
US 2020/0227098 A1 Jul. 16, 2020

(30) Foreign Application Priority Data
Jan. 10, 2019 (FR) ...................................... 19 00222

(51) Int. Cl.
| G11C 11/16 | (2006.01) |
| G11C 16/08 | (2006.01) |
| G11C 7/10 | (2006.01) |
| G11C 7/24 | (2006.01) |
| G11C 11/419 | (2006.01) |
| G11C 16/24 | (2006.01) |

(52) U.S. Cl.
CPC .............. *G11C 7/1006* (2013.01); *G11C 7/24* (2013.01); *G11C 11/419* (2013.01); *G11C 16/24* (2013.01)

(58) Field of Classification Search
CPC ....... G11C 11/419; G11C 11/16; G11C 16/08; G11C 16/24; G11C 7/24; G11C 2029/4402; G11C 29/14; G11C 29/08
See application file for complete search history.

(56) References Cited

U.S. PATENT DOCUMENTS

| 3,593,304 | A | 7/1971 | Gardner et al. | |
| 7,307,911 | B1* | 12/2007 | Anand | G11C 7/065 365/189.07 |
| 7,965,564 | B2* | 6/2011 | Lavi | G11C 15/043 365/189.15 |
| 10,043,581 | B2 | 8/2018 | Noel et al. | |

(Continued)

FOREIGN PATENT DOCUMENTS

EP    3 252 774 A1    12/2017

OTHER PUBLICATIONS

U.S. Appl. No. 16/210,663, filed Dec. 5, 2018, 2019/0172526 A1, Jean-Philippe Noel, et al.

(Continued)

*Primary Examiner* — Hien N Nguyen
(74) *Attorney, Agent, or Firm* — Oblon, McClelland, Maier & Neustadt, L.L.P.

(57) ABSTRACT

A Memory device comprising a matrix of memory cells, the matrix being provided with at least one first column, the device also being provided with a test circuit configured to perform a test phase during a read operation to indicate whether or not the proportion of cells in said column storing the same logical data, particularly a logical '1', is greater than a predetermined threshold.

17 Claims, 4 Drawing Sheets

(56) References Cited

U.S. PATENT DOCUMENTS

| | | | |
|---|---|---|---|
| 2010/0172190 A1 | 7/2010 | Lavi et al. | |
| 2013/0301335 A1* | 11/2013 | Ong | G11C 29/50008 365/148 |
| 2015/0325313 A1* | 11/2015 | Badereddine | G11C 29/04 365/154 |

OTHER PUBLICATIONS

U.S. Appl. No. 16/379,476, filed Apr. 9, 2019, 2019/0312039 A1, Francois Andrieu, et al.

U.S. Appl. No. 16/512,497, filed Jul. 16, 2019, Jean-Philippe Noel.

French Preliminary Search Report dated Nov. 14, 2019 in French Application 1900222 filed Jan. 10, 2019 (with English Translation of Categories of Cited Documents), 2 pages.

Yap San Min, M, et al., "A Novel Dummy Bitline Driver for Read Margin Improvement in an eSRAM," $4^{th}$ IEEE International Symposium on Electronic Design, Test & Applications, 2008, pp. 107-110.

Gupta, S. et al., "A 28nm 6T SRAM memory complier with a variation tolerant replica circuit," SoC Design Conference (ISOCC), 2012, pp. 458-461.

* cited by examiner

CIRCUIT FOR DETECTION OF PREDOMINANT DATA IN A MEMORY CELL

TECHNICAL DOMAIN AND STATE OF PRIOR ART

This application relates to the technical field of memory circuits, particularly those provided with memory dots comprising one or several complementary and auxiliary read ports to perform a read on a memory dot without affecting the content. It is particularly applicable to SRAM (Static Random Access Memory) memories.

Classically, a digital calculation device for example such as a microprocessor is provided with an internal memory and an arithmetic and logic unit (ALU) adapted to the implementation of basic arithmetic and/or logical operations to process data contained in the internal memory.

In-memory computing devices formed from a memory circuit adapted to implement calculation operations have been developed to enable an increase in the speed of some data processing and/or to limit energy consumption related to this processing.

The problem arises of finding a new memory device adapted to investigating the content of a set of memory cells during a read operation.

PRESENTATION OF THE INVENTION

According to one aspect, this application relates to a memory device comprising a matrix of memory cells, the matrix being provided with at least one first column of cells in which each of said cells comprises:
  at least one first storage node to store logical data, particularly "1" or "0", the value of which corresponds to the value of at least one potential at the first storage node,
  at least one read port that, when it is activated, transmits the potential of the first storage node to a first bit line shared by the cells in the first column of cells,
  the device further being provided with a detection circuit, also called the test circuit configured to perform a test phase during a read operation to indicate whether or not the proportion of cells in said column storing the same logical data, particularly a logical '1', is greater than a predetermined threshold, said test circuit comprising:
  a first read node coupled to one end of the first bit line,
  a second read node coupled to one end of a second bit line, the second bit line being associated with a plurality of second logical information storage nodes, said second storage nodes being configured to all store the same logical information or belonging to said cells in said first column respectively, and being storage nodes complementary to said first nodes,
  said test circuit being configured to:
  concomitantly activate k read ports of a number k of cells in said first column while simultaneously activating k other read ports of a corresponding number k of second storage nodes with which these other read ports are associated, to cause discharge of the first bit line and discharge of the second bit line and consequently cause a variation of the potential at said first read node and at the second read node and then, after a predetermined duration, depending on the difference in potentials between said first read node and said second read node:
  produce at least one logical test result signal indicating whether or not the proportion of cells in said column storing a given logical level, in particular a logical "1", is greater than said predetermined threshold, as a function of its value.

The predetermined threshold can be adjusted by means of a stage forming a variable resistance and coupled to at least the first read node. The term "coupled" is used in this description to denote a direct electrical connection or a connection through one or several intermediate components (resistor, transistor, etc.).

Such a test circuit can be used to know the predominant content ('1' or '0') in a column of memory cells in a single read cycle. Depending on the value of the predetermined threshold, it is possible for example to know if there are more than 25%, 50% or 75% of '1's contained in the column of tested cells.

These cells were read simultaneously to evaluate the predominance of one data, for example a logical '1', in a column of memory cells.

Each tested memory cell contributes to the discharge rate of the first bit line and this discharge is typically faster when more '1's are stored. The test circuit starts from the discharge rate or slope to evaluate the number of logical '1's present in the column.

According to a first embodiment of the test circuit, the second bit line is shared by cells in a dummy column, the second storage nodes being storage nodes of dummy memory cells all storing the same logical data, and particularly a logical '1'.

In this embodiment, a dummy column is used as a reference for which the discharge rate of the bit line or the rate of change of the second read node is known.

In this first embodiment, the first read node can be connected to the circuit stage forming a variable resistance and the value of said threshold can be modulated between several predetermined values corresponding to different predetermined resistance values of said stage forming a variable resistance.

Advantageously, this stage forming a variable resistance is provided with a set of m transistors each having a corresponding conducting or blocked conduction state and controlled by a control signal of a set of m transistor control signals, the transistors being arranged in parallel such that the resistance value of said stage varies, and in particular reduces, as a function of the number of transistors among the m transistors that are made conducting.

The control signals can be logical signals and the set of control signals can form a digital selection signal of said threshold with m states, particularly with m=3. In this case, the predetermined thresholds can advantageously be 25%, 50%, and 75% respectively.

The test circuit can be configured so that, after said test phase, a second test phase is performed to indicate whether or not the proportion of cells in said column storing a given logical level, and particularly a logical '1', is greater than at least one second predetermined threshold different from said predetermined threshold.

Advantageously, the test result signal is produced by means of a voltage comparator integrated into the test circuit and the output of which is activated by means of a trigger signal, said voltage comparator being provided with a first input connected to the first read node and a second input connected to said second read node.

Advantageously, the first read node can be connected to a first circuit portion configured to slow said potential variation of said first read node. This first circuit portion can comprise at least one transistor, the conduction of which is controlled by a delay control signal, the amplitude of which depends on said number k of cells in said first column for which the read ports are activated during said test phase.

Advantageously, the second read node can also be connected to a second circuit portion configured to slow said potential variation of said first read node, said second circuit portion comprising at least one transistor, the conduction of which is controlled by a delay control signal, the amplitude of which is modulated as a function of the number k of cells in said first column for which the read ports are activated.

Typically, a read port of a cell is activated by means of a word line shared by the cells in the same line of cells in the matrix, the cells matrix comprising several lines and a plurality of associated word lines. According to one particular aspect, the test circuit may also comprise a circuit block to produce the delay control signal to be sent to said first circuit portion and to said second circuit portion, said block being provided with a plurality of transistors in parallel, the word lines of said plurality of word lines being connected to the gates of said transistors of said block respectively.

According to a second embodiment of the test circuit, the second bit line is a bit line complementary to the first bit line that can be coupled to storage nodes complementary to said first storage nodes of said cells in said first column, and in which a first circuit stage forming a first variable resistance is arranged between the first bit line and the first read node, and in which a second circuit stage forming a second variable resistance is arranged between the complementary bit line and the second read node, the value of said predetermined threshold being modulable as a function of the values of said first variable resistance and said second variable resistance.

In this case, the first circuit stage forming the first variable resistance can advantageously be provided with:
- a first transistor having a conduction state controlled by a first activation signal,
- a second transistor having a conduction state controlled by a second activation signal, the second transistor for which its channel width to length ratio is preferably different from and in particular is less than that of said first transistor.

The second circuit stage forming the second variable resistance may be provided with:
- a third transistor having a conduction state controlled by a third activation signal,
- a fourth transistor having a conduction state controlled by a fourth activation signal, the fourth transistor for which its channel width to length ratio is different from and in particular is less than that of said third transistor.

Preferably, the first transistor of the first stage is identical to the third transistor of said second stage, the fourth transistor in the second stage also preferably being identical to the second transistor in said first stage.

Advantageously, the set of said activation signals forms a selection signal of said threshold, said threshold being selected at a first value of 50% when the first activation signal and said third activation signal are adapted so as to make the first transistor and the third transistor conducting, while the second activation signal and the fourth activation signal are adapted so as to block the second transistor and the fourth transistor respectively.

The test threshold can advantageously be selected to be equal to a second value, particularly 25%, when the first activation signal and the fourth activation signal are adapted so as to make the first transistor and the fourth transistor respectively conducting, while the second activation signal and the third activation signal are designed so as to block the second transistor and the fourth transistor respectively.

The test threshold can advantageously be selected to be equal to a third value, particularly 75%, when the first activation signal and the fourth activation signal are designed so as to block the first transistor and the fourth transistor respectively, while the second activation signal and the third activation signal are designed so as to make the second transistor and the third transistor respectively conducting.

Advantageously, the test result signal can be produced by means of a voltage read amplifier integrated into said test circuit, said voltage read amplifier being provided with a first input connected to the first read node and a second input connected to the said second read node.

The test result signal can be saved at the output from a latch on reception of a trigger signal.

One particular application of the test circuit is to use this circuit to prevent an attempt to access memory data.

Thus, a method of controlling the memory device defined above can be used, comprising application of a control signal modifying the resistance of said stage forming a variable resistance following detection of a signal indicating a fraudulent attempt to access said cells matrix. The value read on the first node is then wrong.

BRIEF DESCRIPTION OF THE DRAWINGS

This invention will be better understood after reading the description of example embodiments given purely for information and that is in no way limitative, with reference to the appended drawings on which.

Furthermore, in the following description, terms that depend on the orientation of the device such as "vertical", "horizontal" should be understood assuming that the device is oriented as shown in the figures.

Identical, similar or equivalent parts of the different figures have the same numeric references to facilitate comparison between the different figures.

DETAILED PRESENTATION OF PARTICULAR EMBODIMENTS

A test circuit as used in one embodiment of this invention and that can be used to determine the predominant content in a column of memory cells is integrated into a memory device provided with a memory matrix formed from a plurality of cell lines and one or several columns of memory cells.

The test circuit is implemented without any modification to the internal structure of memory cells and only requires the use of a restricted number of additional elements peripheral to the cells matrix.

Figure 1A:
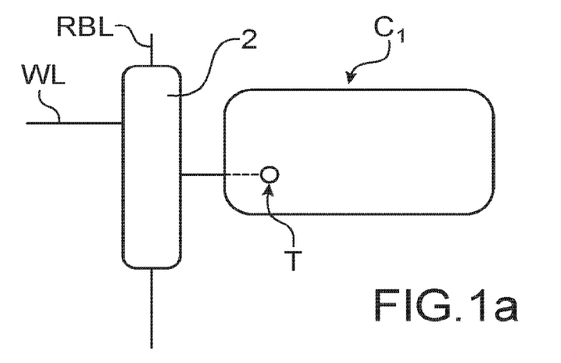
FIGS. 1A-1C illustrate different examples of memory dot structures that can be integrated into a memory device and provided with a statistical test circuit for data contained in the memory and as used according to the invention.

A memory cell Ci (also called a memory dot) of the memory device into which the test circuit is integrated may have a layout as illustrated diagrammatically on FIG. 1A.

Cell Ci represented is provided with at least one storage node T, designed to keep one data item, typically a '1' or a '0', as a function of a potential value maintained on this node T.

Cell Ci also comprises a read port 2 that, when it is activated by a word line WL, can be used to connect the first storage node T to a bit line RBL shared by the cells of the same column ((i.e. a vertical row) of cells as cell Ci. The bit line RBL may in particular be a bit line dedicated to read operations on cell Ci. The word line WL is typically shared by cells in the same line (i.e. a horizontal row) of cells in the matrix as cell Ci.

The read port 2 typically comprises one or several access transistors (not shown on this figure), for which conduction is controlled by a signal applied on the word line WL. The read port 2 is preferably an auxiliary read port or is a port specific to read operations and designed such that during a read operation when the bit line RBL is coupled to the storage node T, the logical data stored by node T is maintained and is not affected.

One particular embodiment includes a memory device formed from SRAM type cells. This type of cell typically has two storage nodes T and F, designed to keep a first logical data and logical data complementary to the first data, the logical data stored at nodes T, F being maintained by transistors forming inverters looped back on themselves.

Figure 1B:
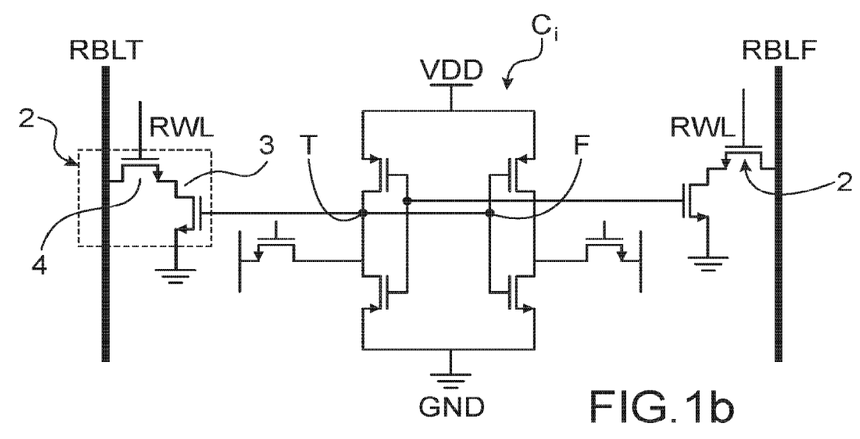
Figure 1C:
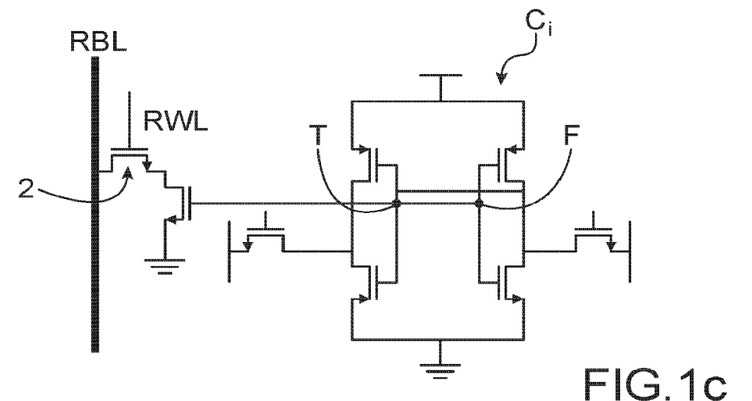

In this case, the SRAM cell may for example be a cell with 6 transistors (6T) or a cell with 8 transistors (8T or 6T+2T) and be provided with a single read port 2 for example like that illustrated on FIG. 1C. A cell provided with two read ports 2 and for example formed from 10 transistors (10T) as illustrated for example on FIG. 1B can also be provided.

In the two examples in FIGS. 1B and 1C, a read port 2 can be formed from several access transistors 21, 22. A first access transistor 3 has its gate connected to one storage node and a second access transistor 4 has its gate connected to a word line RWL this time dedicated to read operations and different from a write word line and its drain connected to a read bit line RBL, $RBL_T$, $RBL_F$ that in this example is used only for read operations and is not used for write. When the line to which cell C1 belongs is not accessed in read, the word line RWL not being activated, in other words typically at a zero potential in the case of an N type access transistor, the path between the bit line RBL and the ground is interrupted. A read operation on the cell is triggered when the word line RWL is activated, in other words a signal emitted on this word line is used to access the storage node T or F associated with this word line RWL.

A test circuit as used according to the invention can thus be used to evaluate the predominance of the same logical data in a set of memory cells as described above and belonging to the same column of cells. In particular, the predominance of cells containing a logical '1' in a column of cells can be evaluated.

More generally, the test circuit is adapted to evaluate whether or not the percentage or the proportion of cells storing a given logical level and particularly a logical '1', among the tested cells in a column of cells, is greater than at least one predetermined variable threshold, this threshold possibly being fixed for example at 25% or for example at 50% or for example at 75%. The predetermined threshold can thus be selected between a plurality of predetermined thresholds, for example between three thresholds: advantageously 25%, 50% and 75%.

The test circuit is configured to perform such a test phase during a read operation or a read cycle, by simultaneously reading several tested cells, in other words by simultaneously accessing the read ports of several tested cells.

Figure 2:
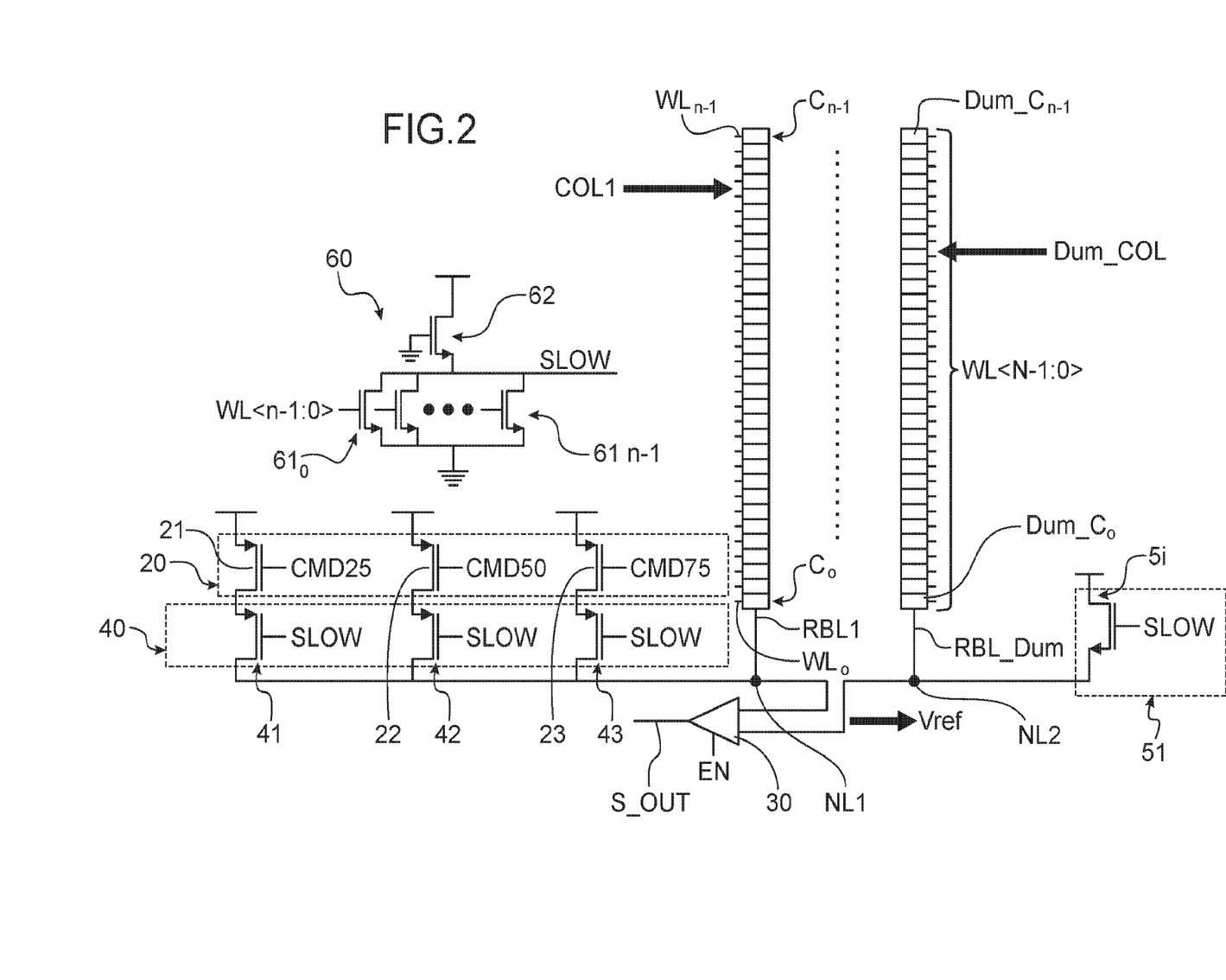
FIG. 2 illustrates a first embodiment of a test circuit that can be used to evaluate whether or not the proportion of cells storing the same logical data, typically a '1', among a set of tested memory cells, is greater than a predetermined threshold, this threshold being variable and chosen from among several predetermined thresholds.
Figure 3:
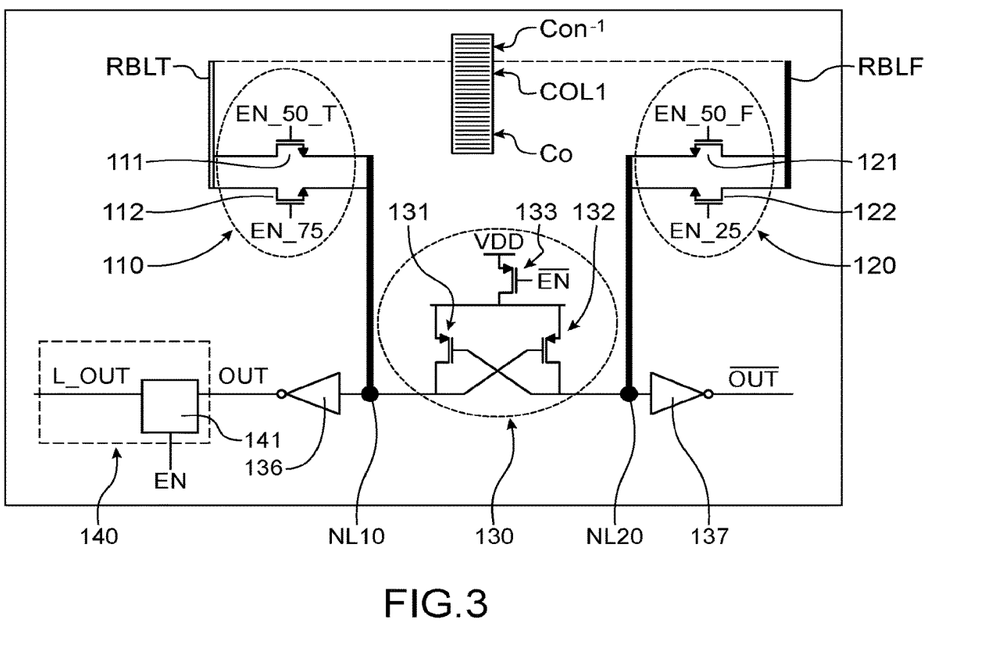
FIG. 3 illustrates a second embodiment of the variable threshold test circuit to test predominance of a logical data in a set of cells in a memory device.

One example embodiment of such a test circuit 10 as used according to a first embodiment of this invention is shown on FIG. 2.

For simplification reasons, the test circuit 10 is represented herein with a single column $COL_1$ of n memory cells $C_1, \ldots, C_n$ (where n may for example by 32) on which it is desired to test the occurrence of data so as to determine whether or not the percentage or the ratio of cells storing the same data among the set of all the cells in this column $COL_1$ or among a group of cells in this column $COL_1$ is greater than a predetermined threshold. Typically, a statistical test is made on the logical data '1' by verifying, for example, whether or not at least M % of cells store the logical data '1'. The test threshold M is set, for example, to 50% or to 25% or to 75%.

The test may be made on a predetermined number of k (in which 2≤k≤n) cells in column $COL_1$, as a function of the number k of word lines activated simultaneously during this test, among a set of n word lines $WL_0, \ldots, WL_{n-1}$.

According to one possible embodiment, the test circuit can comprise or be associated with an activation circuit (not shown) that can be integrated into a line decoder associated with the matrix and that is configured to simultaneously activate word lines, so as to make a simultaneous selection of different rows of corresponding read ports of cells in the column $COL_1$ of cells. In this case, the line decoder can be modified so as to be able to activate several word lines at the same time, or possibly all word lines at the same time, for example by adding a supplementary input or by using outputs from CAM ("Content Addressable Memories") columns.

The tested column $COL_1$ is associated with a bit line $RBL_1$ at the end of which there is a first read node $NL_1$.

In order to perform the test on column $COL_1$, the circuit 10 is also provided with a reference column that, in this example embodiment, is a dummy column Dum_COL composed of n dummy memory cells, in other words that act as a reference or indicating cells rather than a means to be used to write data to be stored. The dummy cells $Dum\_C_0, \ldots Dum\_C_{n-1}$ of the dummy column Dum_COL can be used to produce reference electrical signals. Typically, the number of dummy cells is n (in which for example n is equal to 32) which is the same as in a column COL1 of the matrix and may have a structure similar to the structure of other cells in the memory matrix and for example as described above with reference to FIGS. 1A-1C.

In this example embodiment, the dummy cells $Dum\_C_0, \ldots, Dum\_C_{n-1}$ and their associated storage node are configured to store the same logical data, for example a logical '1'. The dummy cells may thus be provided with at least one storage node continuously forced to a given potential, for example the power supply potential VDD so as to thus obtain a cell on which a read access is possible without being able to make a write access. Such dummy cells $Dum\_C_0, \ldots, Dum\_C_{n-1}$ thus help to produce reference data that remains the same for all read accesses and tests made. The dummy column Dum_COL is associated with a bit line RBL_Dum at the end of which there is a second read node $NL_2$.

Before the test phase and before a read cycle, the first bit line $RBL_1$ and the bit line RBL_Dum associated with the dummy column Dum_COL are typically precharged through a precharge circuit (not shown), for example to a power supply voltage VDD. This precharge circuit can be arranged at one of the bit line $RBL_1$ and at one end of the bit line RBL_Dum opposite that at which the first read node $NL_1$ and the second read node $NL_2$ respectively are located.

When a read or a test is made on k (1≤k≤n, with k preferably being close to n) cells in the column $COL_1$, the precharge of the bit line $RBL_1$ is deactivated before the simultaneous activation of k data word lines $WL_0, \ldots, WL_{n-1}$. This activation of k word lines $WL_0 \ldots, WL_{n-1}$ can simultaneously activate the k read ports of the tested cells respectively, and the k read ports of the dummy cells respectively.

A part of the test phase consists of waiting for bit lines RBL1 and RBL_Dum to discharge, so that the potentials of each of the nodes $NL_1$ and $NL_2$ can be varied, and in this example increased.

The potential of the first node $NL_1$ varies at a rate that depends on the (unknown) number of logical '1's present in the set of k cells in column $COL_1$, while the discharge rate of the dummy column depends on the (known) number k of logical '1's in the k activated cells in the dummy column Dum_COL.

The discharge rates or the slope of nodes $NL_1$ and $NL_2$ are used to evaluate whether or not the number of logical '1's in column $COL_1$ is greater than the predetermined threshold, for example 25% or 50% or 75% of all tested cells in a column.

In this embodiment, the adjustable threshold is adjusted herein using a circuit stage 20 forming a variable resistance connected to the first read node $NL_1$.

The variable resistance in this example is formed from circuit branches coupled to the first read node NL1 and provided with transistors 21, 22, 23, advantageously identical in terms of design and dimensions. The transistors 21, 22, 23, are for example of the PMOS type with corresponding sources connected to a VDD power supply with gates controlled respectively by threshold control signals CMD25, CMD50, CMD75. A first control signal CMD25 tests the conduction state (conducting or blocked) of transistor 21, while a second threshold control signal CMD50 can test the conduction state (conducting or blocked) of transistor 22, and a third threshold control signal CMD75 determines the conduction state (conducting or blocked) of the transistor 23. The value of the resistance is thus adjusted, and particularly reduced, as a function of the number of transistors 21, 22, 23 made conducting.

A cumulative activation is used. Thus, when it is required to fix the test threshold at a first threshold level, for example 25%, only the transistor 21 is active, while when it is required to fix the test threshold to a second threshold level that corresponds to a higher discharge rate of the first bit line RBL1, for example a 50% threshold, the transistors 21, 22 are activated, which in this example reduces the resistance of the stage 20, in particular divides it by 2. The transistors 21, 22, 23 are activated, for example to divide the variable resistance by 3 and to fix a threshold at a third level, for example 75%, which corresponds to an even faster variation of the first read node NL1 during the test phase. The set of control signals CMD25, CMD50, CMD75 thus forms a threshold variation signal that can be digital. For example, such a digital signal is set equal to the value 001 (CMD75=0; CMD50=0; CMD25=1) to fix the threshold at 25%.

When the test phase implemented during a read cycle is started, the potential at the first read node $NL_1$ is set up taking account of several phenomena initially or at the beginning of the test, and particularly:
 pulling towards GND caused by the activation of k read ports by k selected word lines WL.
 pulling towards the voltage VDD caused by the selected branch(es) of stage 20 provided with transistors 21, 22, 23 controlled by signals CMD25, CMD50, CMD75 respectively to choose the comparison threshold: 25%, 50% or 75%.

Similarly, the potential at the second read node $NL_2$ is set up particularly taking account of setting to GND provoked by the k activated read ports.

The potential at the first read node $NL_1$ and at the second read node $NL_2$ are compared using a voltage comparator 30 provided with a first input connected to the first read node NL1 and a second input NL2 connected to said second read node, to be able to evaluate the potential level of the first read node NL1 on comparison with the potential of the second node NL2 acting as reference. A comparator activation signal 30 also called trigger signal EN determines when its inputs and the result of the comparison of its inputs has to be taken into account.

The end of the test operation can be determined arbitrarily, for example using a circuit containing a delay chain that produces the trigger signal EN at a determined delay after the start of the test phase.

A reference path ("dummy path") including the read circuit and with a variable propagation time as a function of different parameters such as the process, voltage levels involved and particularly the power supply, temperature, can be used as variants to generate the trigger signal EN.

An example embodiment of such a circuit is given in the document «A Novel Dummy Bitline Driver for Read Margin Improvement in an eSRAM» by Michael Yap San Min et al., *DELTA '08: Fourth IEEE International Symposium on Electronic Design, Test and Applications*, January 2008, Hong Kong, China, IEEE Computer Society, pp. 107-110, 2008, particularly in relation with FIG. 1.

Another example embodiment is given in document "A 28 nm 6T SRAM memory compiler with a variation tolerant replica circuit" SoC Design Conference (ISOCC), 2012 International.

The comparator 30 outputs a logical test result signal S_OUT that, depending on its state '1' or '0' indicates whether (for example state '1') or not (state '0') the proportion of tested cells storing the value '1' exceeds the test threshold, for example 50% of cells.

To mitigate an excessively fast variation of the potential at the first read node NL1 during the test phase described above during a read cycle, a circuit portion 40 can be provided configured to delay the potential variation of the first read node NL1. This circuit portion 40 is provided with transistors 41, 42, 43, for example PMOS type transistors, put in series with transistors 21, 22, 23 of the stage 20 forming a variable resistance. Conduction of transistors 41, 42, 43 used to implement the delay is controlled by a SLOW delay control signal applied to their gate. The amplitude of this SLOW signal depends on the number k of cells in said first column $COL_1$, the read ports of which are activated during the test phase.

To avoid an excessively fast variation of the potential of the second read node NL2 during the test phase described above made during a read operation, a circuit portion 50 can also be provided equipped with a transistor 52, for example of the PMOS type connected to a potential, for example VDD, and the conduction of which is controlled by the same delay control signal SLOW.

An example of a block 60 to produce the delay control signal SLOW to be sent to transistors 41, 42 is shown on FIG. 2.

The block 60 is also formed from n transistors $61_1, \ldots, 61_n$, for example of the NMOS type, with a common source and common drain that are thus arranged in parallel.

Each transistor gate is controlled by a specific word line among the n word lines $WL_0, \ldots, WL_{n-1}$ used to access the n cells of a column of cells in read. The word lines $WL_0, \ldots, WL_{n-1}$ are thus connected to the corresponding gates of said n transistors $61_1, \ldots, 61_n$, respectively. Consequently, the SLOW signal drawn off at the common drain of transistors $61_0, \ldots, 61_{n-1}$ depends on the number of word lines $WL_0, \ldots, WL_{n-1}$ activated during the test phase. The larger the number of word lines $WL_0, \ldots, WL_{n-1}$ and therefore cells in column COL1 read, activated, the more closely this SLOW signal approaches the GND reference potential in this example, that tends to increase the conductivity of transistors 21, 22, 23. The block 60 is typically also provided with a PMOS transistor 62, acting as a generator and the drain of which is connected to the VDD power supply, the gate held to the ground potential and the source connected to a node outputting the SLOW delay control signal.

In the case in which the n (for example with n equal to 32) word lines 32 are activated, the bit line $RBL_1$ and the reference bit line RBL_dummy are strongly pulled towards GND through the read ports, but in this case the SLOW signal very close to GND activates all PMOS transistors $61_1, \ldots, 61_n$ so as to keep nodes $NL_1$ and $NL_2$ far from GND.

It may be desirable to refine the test result obtained after a test phase implemented during a read cycle. To achieve this, a sequence of several tests can be used during which the threshold is modified.

For example, a first test is performed with a first threshold, for example 25% corresponding to a first set of control signal values CMD25, CMD50, CMD75 that determines a first resistance value of stage 20 to be used. The potential variation of the first read node NL1 is thus calibrated when the read ports are activated and the first bit line RBL1 discharges. Then, if for example the signal S_OUT indicates that the number of cells storing the value '1' is more than 25%, a second test can be performed to obtain a more precise evaluation of the quantity of '1's stored.

A second test can then be performed with a second threshold, for example 50% corresponding to a second set of control signal values CMD25, CMD50, CM75 that determines a second resistance value of stage 20.

When the quantity of '1's stored in the tested column is close to the second threshold, in the event 50%, the test result may be uncertain. A third test can then be performed with a third threshold, for example 75% corresponding to a third set of control signal values CMD25, CMD50, CM75 that determines a third resistance value of stage 20. The signal S_OUT then indicates that the number of cells storing the value '1' is less than 75%.

Figure 4:
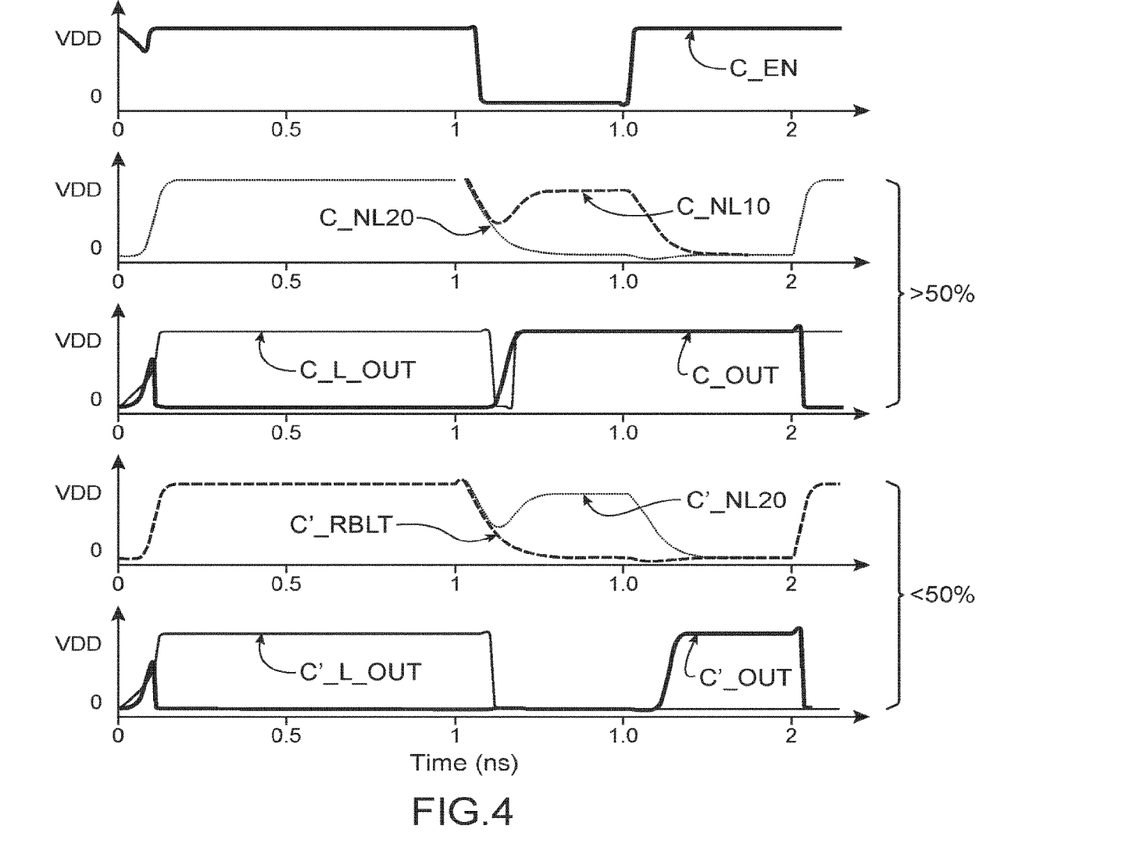
FIG. 4 illustrates different examples of signals used during a first test implemented by a test circuit according to the invention for which a tested column of cells comprises a majority of '1's and during a second test for which a tested column of cells comprises a minority of '1's.

A variant embodiment of the test circuit for which the energy consumption is low is given on FIG. 4.

It applies to the implementation of a test on a column COL1 of cells, for example of the SRAM type, provided with complementary storage nodes storing logical data and its complementary data respectively.

As in the preceding example embodiment, the content of the column COL1 of cells $C_0, \ldots, C_{n-1}$ is evaluated using a first bit line RBLT intended, during a test phase performed during a read cycle, to be brought to the potential of a first storage node of cells in the first column, and the discharge rate of which is evaluated at a first read node NL10 coupled to this first bit line RBLT. This time, rather than using the storage nodes of a dummy column of cells, a second bit line RBLF is used that during a test phase performed during a read cycle will be brought to the potential of a second storage node of cells in the first column, complementary to the first node. The discharge rate of the second bit line RBLF is evaluated, providing information on the potentials of the second storage nodes and therefore on logical data stored by these second nodes starting from a second read node NL20 coupled to the second bit line RBLF.

The test circuit in this case is provided with a first circuit stage 110 forming a first variable resistance and that is located between one end of the first bit line RBLT and the first read node NL10.

In this example embodiment, the first variable resistance is made by means of a transistor 111, for example of the NMOS type, and another transistor 112 in parallel, for example of the NMOS type. The transistors 111, 112 have their drains coupled to the first bit line RBLT and their sources coupled to the first read node NL10.

The conduction state of transistor 111 is controlled by an activation signal EN_50_T applied on its gate, while the conduction state of transistor 112 is controlled by another activation signal EN_75 applied on its gate.

The test circuit is also provided with a second circuit stage 120 forming a second variable resistance and that is located between one end of the bit line RBLT complementary to the column $COL_1$ and the second read node NL20.

The second variable resistance can also be made by means of transistors in parallel, with a transistor 121, for example of the NMOS type, and another transistor 122, for example of the NMOS type, having drains connected to each other and to one end of the second bit line RBLF and sources connected to the second read node NL20.

The transistor 121, is made conducting or blocked as a function of an activation signal EN_50_F applied on its gate, while the transistor 122 can be made conducting or blocked by means of an activation signal EN_25 applied on its gate.

The transistors 111, 121 are preferably identical. The transistors 112, 122 also have identical design and size. The transistors 112, 122 are designed to have different dimensions from the transistors 111, 121, particularly with different W/L (width to length in the channel region) ratios. In this example, the transistors 112, 122 are designed to have a width W2 less than the width W1 of the transistors 111, 121.

In this example embodiment, when the test threshold is fixed for example at 50%, when the test is intended to determine if the column COL1, comprises a majority of '1's at its first storage nodes of cells in this column COL1, the resistance of the first stage 110 and the resistance of the second stage 120 are balanced by making transistors 111, 121 conducting while transistors 112, 122 are not activated.

Transistors 112, 122 are used to set up other test thresholds by creating an unbalanced resistance between the first stage 110 and the second stage 120.

In this example embodiment, a second test threshold for example of 25% is set up by making transistor 111 of the first stage 110 and transistor 122 of the second stage 120 conducting, while transistors 112, 121 are not activated, in other words they are put into a blocked state. This second configuration, for which the resistance of the first stage 110 is less than the resistance of the second stage 120 can for example be used to determine whether or not the column COL1 comprises at least 25% of '1's at first cell storage nodes.

A third test threshold for example can also be set up by making transistor 112 of the first stage 110 and transistor 121 of the second stage 120 conducting, while transistors 111, 122 are not activated, in other words they are in a blocked state. This third configuration, for which the resistance of the first stage 110 is in this case greater than the resistance of the second stage 120 can for example be used to determine whether or not the column COL1 comprises at least 75% of '1's at the first cell storage nodes.

The activation signals EN_50_T, EN_50_F, EN_25, EN_75 are typically logical signals. The set of activation signals EN_50_T, EN_50_F, EN_25, EN_75 forms a digital threshold selection signal that, in the particular embodiment described above can adopt 3 different states depending on the threshold selected among the 3 available test thresholds, for example 25%, 50%, 75%. A larger number of thresholds could be envisaged by increasing the number of transistors in stages 110, 120 and the associated activation signals.

Consecutive to simultaneous activation of the read ports of the first storage nodes and the complementary storage nodes, the first bit line is discharged at a rate that depends on the number of logical '1's stored in the set of tested storage nodes and that is different from that for the complementary bit line.

This difference in the charge rate of lines results in a unbalance between the first read node NL10 and the second read node NL20. This unbalance is amplified by means of a read amplifier 130.

The read amplifier may be formed from charge transistors 131, 132, for example of the PMOS type connected to each other in a crossed manner such that the gate of one charge transistor 131 is connected to the second read node NL20, while the gate of the other charge transistor 132 is connected to the first read node NL10, the drain of the charge transistor 132 being connected to the gate of the charge transistor 131. The transistors 131, 132 are provided with a common source that can be brought to a power supply potential VDD by means of a switch transistor 133, the conduction of which depends on the test signal. The transistor 133 may for example be a PMOS type transistor 133 made conducting by a signal $\overline{EN}$ complementary to the trigger signal EN.

A test result signal OUT is provided at the output from a first inverter 136 connected to the first read node NL20, while a complementary signal $\overline{OUT}$ can be drawn off at the output from another inverter 137, the input of which is connected to the first read node NL10. An asynchronous latch 141 controlled by the trigger signal EN can save the value of the test result in the form of a signal L_OUT.

The following table summarises the different possible states of activation signals EN_50_T, EN_50_F, EN_25, EN_75 of stages 110, 120 forming variable resistances to select different test thresholds, the result of which is signified by the test result signal OUT.

| Read test | Activation signal configuration | | | | Result | |
|---|---|---|---|---|---|---|
| | EN_50_T | EN_50_F | EN_25 | EN_75 | OUT | |
| 25% | 1 | 0 | 1 | 0 | 1 (>25%) | 0 (<25%) |
| 50% | 1 | 1 | 0 | 0 | 1 (>50%) | 0 (<50%) |
| 75% | 0 | 1 | 0 | 1 | 1 (>75%) | 0 (<75%) |

On FIG. 4, variation curves C_EN, C_NL20, C_NL10, C_OUT, C_OUT_latch give examples of curves for variation of the trigger signal EN, the signal taken at the second node NL20, the signal taken at the first node NL10, the output signal OUT from the first inverter, and the test result signal at the output from the latch, for a test done on a column of cells comprising more than 50% of cells storing the value '1'.

Other variation curves C'_NL20, C'_NL10, C'_OUT, C'_OUT_latch give examples of curves for variation of the signal taken at the second node NL20, the signal taken at the first node NL10, the output signal OUT from the first inverter, and the test result signal at the output from the latch, for a test done on a column of cells this time comprising fewer than 50% of cells storing the value '1'.

A test circuit integrated into a memory device and as described above is used particularly in applications in the image processing field.

A test circuit integrated into a memory device and as described above can be applied to protection of data in the memory.

For example, when an attack is detected aiming at knowing the content of memory and an attack detection signal is produced, some control signals of the test circuit, and particularly one or several control signals EN_50_T, EN_75, EN_50_F, EN_25, or one of the other activation signals CMD25, CMD50 or CMD75, are forced constantly. A data read made on the read node NL1 or NL10 would then be wrong.

The invention claimed is:

1. A memory device comprising a matrix of memory cells, the matrix being provided with at least one first column of cells wherein each of said cells comprises:
   at least one first storage node to store logical data, particularly "1" or "0", the value of which corresponds to the value of at least one potential at said first storage node,
   at least one read port that, when activated, transmits the potential of the first storage node to a first bit line shared by the cells in the first column of cells,
   the device further being provided with a test circuit configured to perform a test phase during a read operation to indicate whether or not the proportion of cells in said column storing the same logical data, particularly a logical '1', is greater than a predetermined threshold, said test circuit comprising:
   a first read node coupled to one end of the first bit line,
   a second read node coupled to one end of a second bit line, the second bit line forming a reference bit line associated with a plurality of second logical information storage nodes, said second storage nodes being configured to all store the same logical information or belonging to said cells in said first column respectively, and being storage nodes complementary to said first nodes,
   at least one stage forming a variable resistance to adjust said predetermined threshold, said stage being coupled to at least the first read node, said test circuit being configured to:
   concomitantly activate k read ports of a number k of cells in said first column while simultaneously activating k other read ports of a corresponding number k of second storage nodes with which these other read ports are associated, to cause discharge of the first bit line and discharge of the second bit line and consequently cause a variation of the potential at said first read node and at the second read node and then, after a predetermined duration, depending on the difference in potentials between said first read node and said second read node:

produce at least one logical test result signal indicating whether or not the proportion of cells in said column storing a given logical level, in particular a logical "1", is greater than said predetermined threshold, as a function of its value.

2. The memory device according to claim 1, wherein the second bit line is shared by cells in a dummy column, the second storage nodes being storage nodes of dummy memory cells all storing the same logical data, and particularly a logical '1'.

3. The memory device according to claim 2, wherein the first read node is connected to the circuit stage forming a variable resistance, the value of said threshold can be modulated between several predetermined values corresponding to different predetermined resistance values of said stage.

4. The memory device according to claim 3, wherein the circuit stage forming a variable resistance is provided with a set of m transistors each having a corresponding conducting or blocked conduction state and controlled by a control signal of a set of m transistor control signals, the transistors being arranged in parallel such that the resistance value of said stage varies, and in particular reduces, as a function of the number of transistors among the m transistors that are made conducting.

5. The memory device according to claim 4, the set of control signals forms a digital selection signal with m states of said threshold, particularly with m=3, the predetermined thresholds advantageously being 25%, 50%, 75% respectively.

6. The memory device according to claim 2, wherein the test circuit is configured so that, after said test phase, a second test phase is performed to indicate whether or not the proportion of cells in said column storing a given logical level, and particularly a logical '1', is greater than at least one second predetermined threshold different from the first threshold.

7. The memory device according to claim 2, wherein the test result signal is produced by means of a voltage comparator integrated into the test circuit and the output of which is activated by means of a trigger signal, said voltage comparator being provided with a first input connected to the first read node and a second input connected to said second read node.

8. The memory device according to claim 2, wherein the first read node is connected to a first circuit portion configured to slow said potential variation of said first read node, said first circuit portion (40) comprising at least one transistor (41, 42, 43) the conduction of which is controlled by a delay control signal (SLOW), the amplitude of which depends on said number k of cells in said first column (COL1) for which the read ports are activated during said test phase.

9. The memory device according to claim 2, wherein the second read node is connected to a second circuit portion configured to slow said potential variation of said first read node, said second circuit portion comprising at least one transistor the conduction of which is controlled by a delay control signal, the amplitude of which is modulated as a function of the number k of cells in said first column for which the read ports are activated.

10. The memory device according to claim 9, wherein a read port of a cell is activated by means of a word line shared by the cells in the same line of cells in the matrix, and wherein the cells matrix comprises several lines and a plurality of associated word lines, said test circuit further comprising a circuit block to produce the delay control signal addressed to said transistor of said first circuit portion and said transistor of said second circuit portion, said circuit block being provided with a plurality of transistors in parallel, the word lines of said plurality of word lines being connected to the gates of said transistors of said block respectively.

11. The memory device according to claim 1, wherein the second bit line is a bit line complementary to the first bit line that can be coupled to storage nodes complementary to said first storage nodes of said cells in said first column, and in which a first circuit stage forming a first variable resistance is connected between the first bit line and the first read node, and in which a second circuit stage forming a second variable resistance is connected between the complementary bit line and the second read node, the value of said threshold being modulable as a function of the values of said first variable resistance and said second variable resistance.

12. The memory device according to claim 11, wherein the first circuit stage forming the first variable resistance is provided with:
a first transistor having a conduction state controlled by a first activation signal,
a second transistor having a conduction state controlled by a second activation signal, the second transistor having a channel width to length ratio different from that of said first transistor,
the second circuit stage forming the second variable resistance being provided with:
a third transistor having a conduction state controlled by a third activation signal,
a fourth transistor having a conduction state controlled by a fourth activation signal, the fourth transistor having a channel width to length ratio different from that of said third transistor, the first transistor of the first stage being identical to the third transistor of said second stage, the fourth transistor of the second stage being identical to the second transistor of said first stage.

13. The memory device according to claim 12, wherein the set of said activation signals forms a selection signal of said threshold, said threshold being selected at a first value of 50% when the first activation signal and said third activation signal are adapted so as to make the first transistor and the third transistor conducting, while the second activation signal and the fourth activation signal are adapted so as to block the second transistor and the fourth transistor respectively.

14. The memory device according to claim 13, wherein the test threshold is selected to be equal to a second value, particularly 25%, when the first activation signal and the fourth activation signal are adapted so as to make the first transistor and the fourth transistor respectively conducting, while the second activation signal and the third activation signal are designed so as to block the second transistor and the fourth transistor respectively, said test threshold being selected to be equal to a third value, particularly 75%, when the first activation signal and the fourth activation signal are designed so as to make the first transistor and the fourth transistor respectively blocked, while the second activation signal and the third activation signal are designed so as to make the second transistor and the fourth transistor respectively conducting.

15. The memory device according to claim 11, wherein the test result signal is produced by means of a voltage read amplifier integrated into said test circuit, said voltage read amplifier being provided with a first input connected to the first read node and a second input connected to said second read node.

16. The memory device according to claim 15, wherein said test result signal is saved at the output from a latch following reception of a trigger signal.

17. A method for controlling a memory device according to claim 1, comprising: application of a control signal modifying the resistance of said stage forming a variable resistance following detection of a signal indicating a fraudulent attempt to access said cells matrix.

\* \* \* \* \*